United States Patent
Wu et al.

(10) Patent No.: US 11,443,789 B1
(45) Date of Patent: Sep. 13, 2022

(54) MEMORY DEVICE

(71) Applicants: Jiangsu Advanced Memory Technology Co., Ltd., Jiangsu (CN); Siloam Holdings Co., Ltd., Hsinchu County (TW)

(72) Inventors: Jui-Jen Wu, Hsinchu County (TW); Toshio Sunaga, Hsinchu County (TW); Hsiu-Chun Tsai, Hsinchu County (TW)

(73) Assignees: JIANGSU ADVANCED MEMORY TECHNOLOGY CO., LTD., Jiangsu (CN); SILOAM HOLDINGS CO., LTD., Hsinchu County (TW)

( * ) Notice: Subject to any disclaimer, the term of this patent is extended or adjusted under 35 U.S.C. 154(b) by 0 days.

(21) Appl. No.: 17/239,710

(22) Filed: Apr. 26, 2021

(30) Foreign Application Priority Data

Mar. 16, 2021 (CN) .......................... 202110280084.9

(51) Int. Cl.
    *G11C 8/10* (2006.01)
(52) U.S. Cl.
    CPC ...................................... *G11C 8/10* (2013.01)
(58) Field of Classification Search
    CPC ........................................................ G11C 8/10
    USPC ...................................................... 365/230.06
    See application file for complete search history.

(56) References Cited

U.S. PATENT DOCUMENTS

| 5,511,033 A * | 4/1996 | Jung ...................... G11C 11/406 365/230.02 |
| 2021/0150958 A1* | 5/2021 | Lan ...................... G11C 7/1096 |

* cited by examiner

*Primary Examiner* — Anthan Tran
(74) *Attorney, Agent, or Firm* — CKC & Partners Co., LLC

(57) ABSTRACT

A memory device includes a memory group and a control circuit. The memory group includes several memory banks. The control circuit is coupled to the memory group. The control circuit includes a tri-state logic enable circuit and an address decoding circuit. The tri-state logic enable circuit is configured to temporarily store several temporarily stored address signals, to output the several temporarily stored address signals according to a synchronization signal, to decode the several temporarily stored address signals to generate an enable signal, and to transmit the enable signal to one of the several memory banks. The address decoding circuit is configured to decode the several temporarily stored address signals to drive the one of the several memory banks.

9 Claims, 5 Drawing Sheets

| Addr0 | Addr1 | Addr2 | En0 | En1 | En2 | En3 | En4 | En5 | En6 | En7 |
|---|---|---|---|---|---|---|---|---|---|---|
| 0 | 0 | 0 | 1 | 0 | 0 | 0 | 0 | 0 | 0 | 0 |
| 0 | 0 | 1 | 0 | 1 | 0 | 0 | 0 | 0 | 0 | 0 |
| 0 | 1 | 0 | 0 | 0 | 1 | 0 | 0 | 0 | 0 | 0 |
| 0 | 1 | 1 | 0 | 0 | 0 | 1 | 0 | 0 | 0 | 0 |
| 1 | 0 | 0 | 0 | 0 | 0 | 0 | 1 | 0 | 0 | 0 |
| 1 | 0 | 1 | 0 | 0 | 0 | 0 | 0 | 1 | 0 | 0 |
| 1 | 1 | 0 | 0 | 0 | 0 | 0 | 0 | 0 | 1 | 0 |
| 1 | 1 | 1 | 0 | 0 | 0 | 0 | 0 | 0 | 0 | 1 |

MEMORY DEVICE

CROSS-REFERENCE TO RELATED APPLICATION

This application claims the priority benefit of Chinese Application serial no. 202110280084.9, filed Mar. 16, 2021, the full disclosure of which is incorporated herein by reference.

TECHNICAL FIELD

The present disclosure relates to a memory device. More particularly, the present disclosure relates to a memory device with a common data bus.

DESCRIPTION OF RELATED ART

For memory devices with several memory groups or several memory banks, it is usually necessary to read data through a common data bus. When the distance between different memory groups is too far, and the decoder is located at one end, a large time lag is occurred between the enable signals of different memory groups, causing output data collision.

Furthermore, if there are more memory banks, there must be corresponding enable control signals between each memory bank, which requires many decoding control signal lines, and a larger space is required to accommodate several decoding control signal lines.

SUMMARY

An aspect of the present disclosure is to provide a memory device includes a memory group and a control circuit. The memory group includes several memory banks. The control circuit is coupled to the memory group. The control circuit includes a tri-state logic enable circuit and an address decoding circuit. The tri-state logic enable circuit is configured to temporarily store several temporarily stored address signals, to output the several temporarily stored address signals according to a synchronization signal, to decode the several temporarily stored address signals to generate an enable signal, and to transmit the enable signal to one of the several memory banks. The address decoding circuit is configured to decode the several temporarily stored address signals to drive the one of the several memory banks.

BRIEF DESCRIPTION OF THE DRAWINGS

The present disclosure can be more fully understood by reading the following detailed description of the embodiment, with reference made to the accompanying drawings as follows:

FIG. 5 is a schematic diagram illustrating a decoding table according to some embodiments of the present disclosure.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
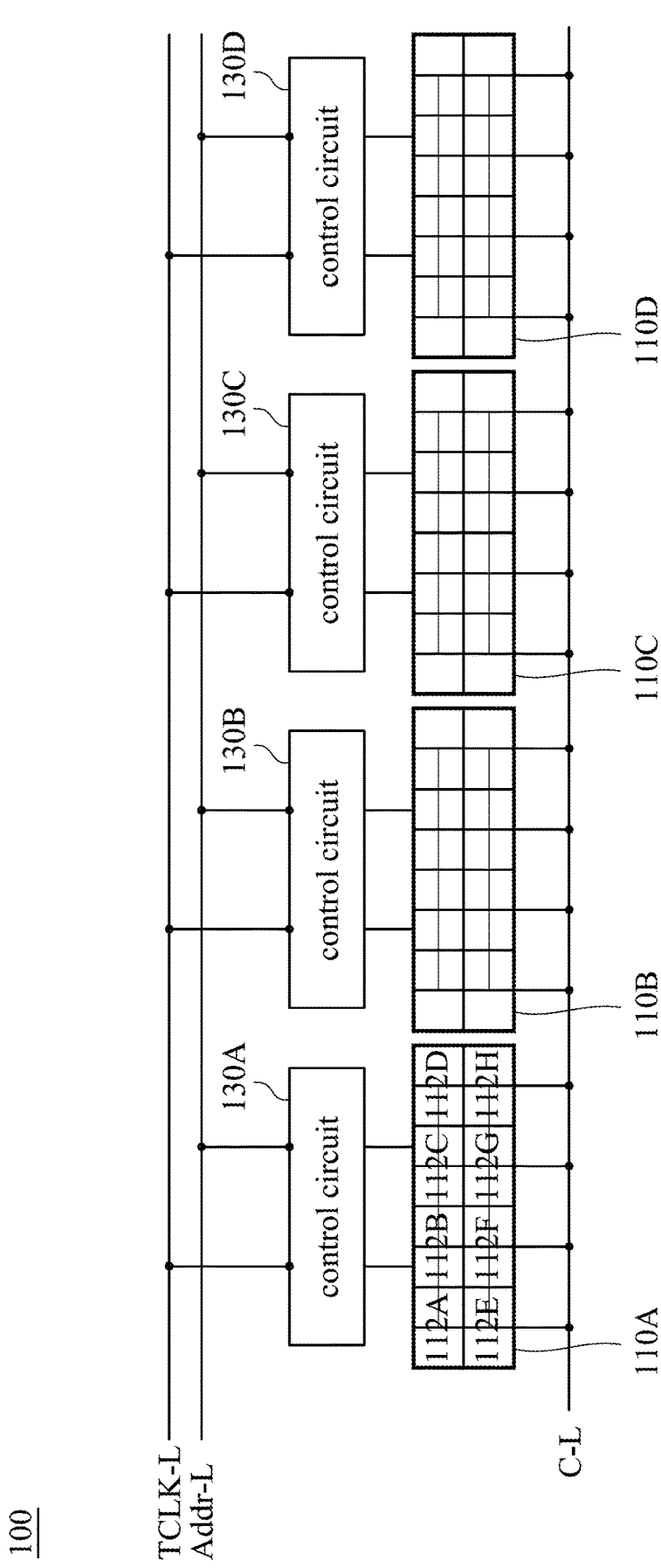
FIG. 1 is a schematic diagram illustrating a memory device according to some embodiments of the present disclosure.

Reference is made to FIG. 1. FIG. 1 is a schematic diagram illustrating a memory device 100 according to some embodiments of the present disclosure. As illustrated in FIG. 1, the memory device 100 includes memory groups 110A to 110D and control circuits 130A to 130D. In the connection relationship, the memory group 110A is connected to the control circuit 130A, the memory group 110B is connected to the control circuit 130B, the memory group 110C is connected to the control circuit 130C, the memory group 110D is connected to the control circuit 130D. Each of the memory groups 110A to 110D connects to the common data bus C-L. Each of the control circuits 130A to 130D connects to the address signal line Addr-L and the synchronization signal line TCLK-L.

As illustrated in FIG. 1, the memory group 110A includes several memory banks 112A to 112H. Each of the memory banks 112A to 112H connects to the common data bus C-L. Each of the memory groups 110B to 110D includes its own memory bank.

It should be noted that, the memory device 100 as illustrated in FIG. 1 is for illustrative purposes only, the number of the memory groups and the memory banks are not limited thereto.

Figure 2:
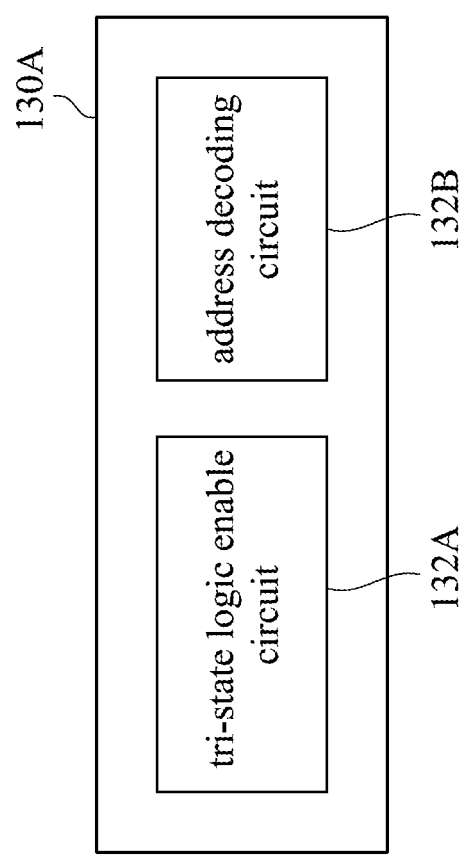
FIG. 2 is a schematic diagram illustrating a control circuit according to some embodiments of the present disclosure.

Reference is made to FIG. 2. FIG. 2 is a schematic diagram illustrating a control circuit 130A according to some embodiments of the present disclosure. For ease of illustration, the control circuit 130A is taken as an example for illustrative purpose, and the remaining control circuits 130B to 130D are similar to the control circuit 130A, and the description is not repeated here.

As illustrated in FIG. 2, the control circuit 130A includes the tri-state logic enable circuit 132A and the address decoding circuit 132B. In the operational relationship, the tri-state logic enable circuit 132A is configured to temporarily store several temporarily stored address signals, to decode several temporarily stored address signals to generate the enable signal, and to transmit the enable signal to one of the several memory banks 112A to 112H connecting to the control circuit 130A. The address decoding circuit 132B is configured to decode several temporarily stored address signals temporarily stored by the tri-state logic enable circuit 132A, so as to drive one of the several memory banks 112A to 112H. The detailed operation methods of the tri-state logic enable circuit 132A and the address decoding circuit 132B will be described in FIG. 3 to FIG. 5 below.

Figure 3:
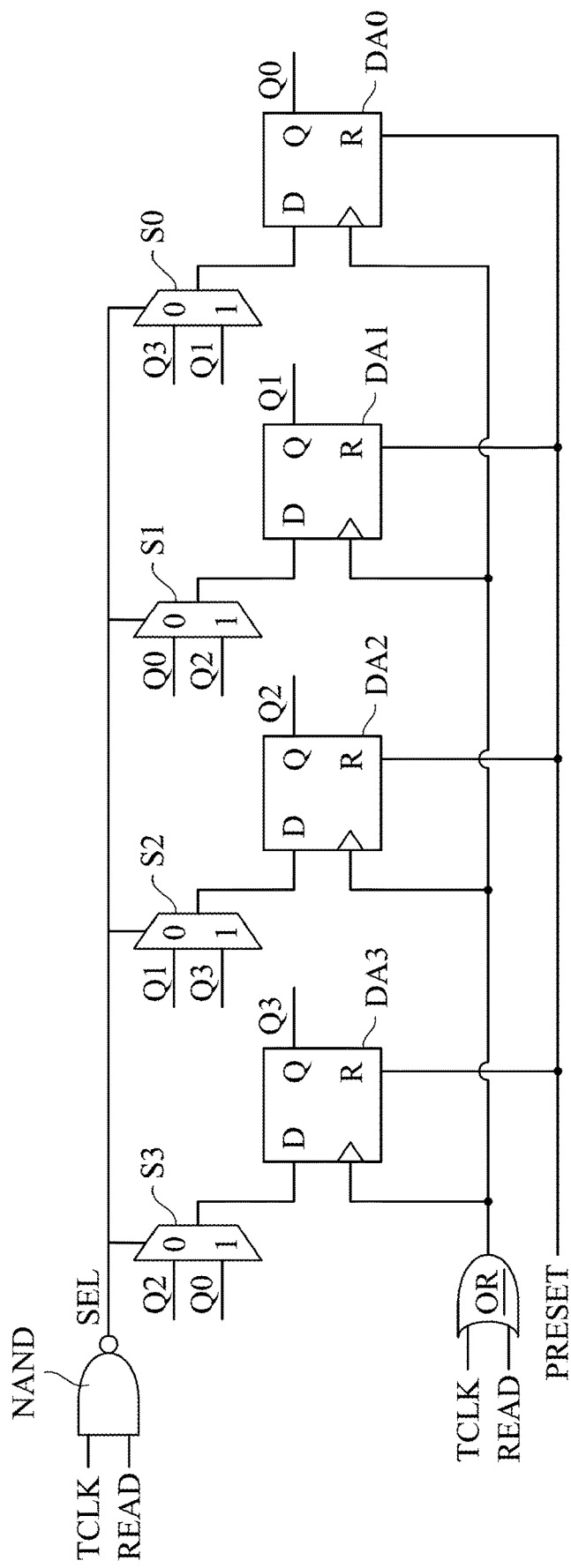
FIG. 3 is a schematic diagram illustrating a sequence circuit according to some embodiments of the present disclosure.
Figure 4:
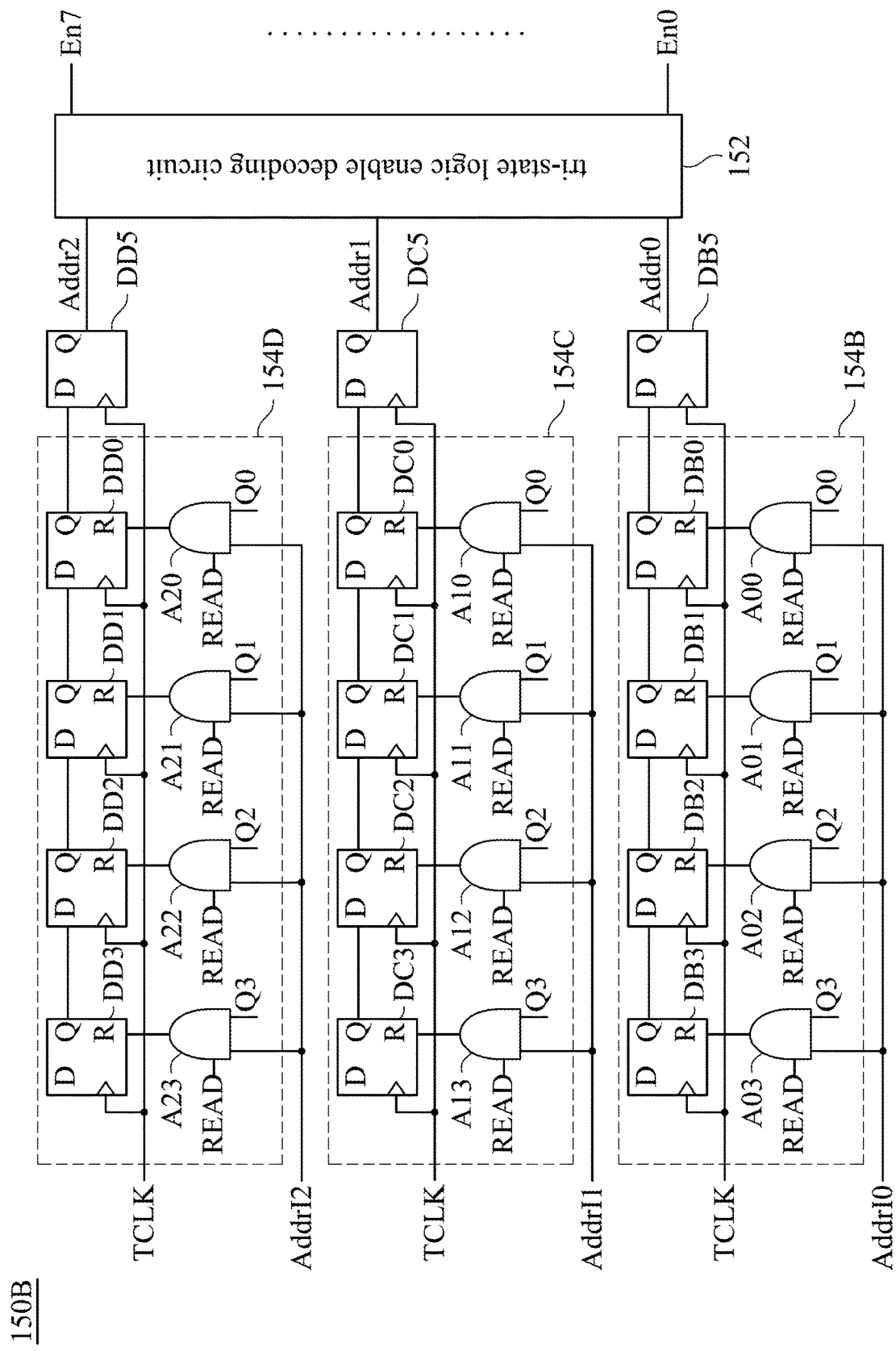
FIG. 4 is a schematic diagram illustrating a sequence circuit according to some embodiments of the present disclosure.

Reference is made to FIG. 3 and FIG. 4. FIG. 3 is a schematic diagram illustrating a sequence circuit 150A according to some embodiments of the present disclosure. FIG. 4 is a schematic diagram illustrating a sequence circuit 150B according to some embodiments of the present disclosure.

In some embodiments, the tri-state logic enable circuit 132A as illustrated in FIG. 2 includes the sequence circuit 150A as illustrated in FIG. 3 and the sequence circuit 150B as illustrated in FIG. 4. The sequence circuit 150B in FIG. 4 includes the tri-state logic enable decoding circuit 152.

In the operational relationship, the sequence circuit 150A in FIG. 3 is configured to generate several indicator signals Q0 to Q3 according to the synchronization signal TCLK and the read signal READ. The sequence circuit 150B in FIG. 4 is configured to store and output the temporarily stored address signals Addr0 to Addr2 according to the indicator signals Q0 to Q3, the synchronization signal TCLK and the read signal READ, and the tri-state logic enable decoding circuit 152 is configured to generate the enable signals En0 to En7 according to the temporarily stored address signals Addr0 to Addr2. The detailed structure and operation of the sequence circuit 150A and the sequence circuit 150B will be described in below.

As illustrated in FIG. 3, wherein the sequence circuit 150A includes a flip flop sequence composed of several D flip flops DA0 to DA3. Several D flip flops DA0 to DA3 sequentially connect in the order of D flip flop DA0, D flip flop DA1, D flip flop DA2, D flip flop DA3.

The output terminal of the D flip flop DA0 is configured to output the indicator signal Q0, the first input terminal of the D flip flop DA0 is configured to receive the indicator signal Q1 output by the D flip flop DA1 or the indicator signal Q3 output by the D flip flop DA3. The second input terminal of the D flip flop DA0 is configured to receive the read signal READ or the synchronization signal TCLK, the third input terminal D of the flip flop DA0 is configured to receive the preset signal PRESET.

The output terminal of the D flip flop DA1 is configured to output the indicator signal Q1, the first input terminal of the D flip flop DA1 is configured to receive the indicator signal Q0 output by the D flip flop DA0 or the indicator signal Q2 output from the D flip flop DA2. The second input terminal of the D flip flop DA1 is configured to receive the read signal READ or the synchronization signal TCLK, the third input terminal of the D flip flop DA1 is configured to receive the preset signal PRESET.

The output terminal of the D flip flop DA2 is configured to output the indicator signal Q2, the first input terminal of the D flip flop DA2 is configured to receive the indicator signal Q1 output by the D flip flop DA1 or the indicator signal Q3 output by the D flip flop DA3, the second input terminal of the D flip flop DA2 is configured to receive the read signal READ or the synchronization signal TCLK. The third input terminal of the D flip flop DA2 is configured to receive the preset signal PRESET.

The output terminal of the D flip flop DA3 is configured to output the indicator signal Q3, the first input terminal of the D flip flop DA3 is configured to receive the indicator signal Q2 output by the D flip flop DA2 or the indicator signal Q0 output by the D flip flop DA0. The second input terminal of the D flip flop DA3 is configured to receive the read signal READ or the synchronization signal TCLK, the third input terminal of the D flip flop DA3 is configured to receive the preset signal PRESET.

The second input terminal of the D flip flops DA0 to DA3 is connected to the OR gate OR. The first input terminal of the OR gate OR is configured to receive the synchronization signal TCLK, the second input terminal of the OR gate OR is configured to receive the read signal READ, the output terminal of the OR gate OR is configured to output the synchronization signal TCLK or the read signal READ.

The first input terminal of the D flip flop DA0 is connected to the selector S0. The control terminal of the selector S0 is configured to receive the select signal SEL, the first input terminal of the selector S0 is configured to receive the indicator signal Q3, and the second input terminal of the selector S0 is configured to receive the indicator signal Q1.

The first input terminal of the D flip flop DA1 is connected to the selector S1. The control terminal of the selector S1 is configured to receive the select signal SEL, the first input terminal of the selector S1 is configured to receive the indicator signal Q0, and the second input terminal of the selector S0 is configured to receive the indicator signal Q2.

The first input terminal of the D flip flop DA2 is connected to the selector S2. The control terminal of the selector S2 is configured to receive the select signal SEL, the first input terminal of the selector S2 is configured to receive the indicator signal Q1, and the second input terminal of the selector S0 is configured to receive the indicator signal Q3.

The first input terminal of the D flip flop DA3 is connected to the selector S3. The control terminal of the selector S3 is configured to receive the select signal SEL, the first input terminal of the selector S3 is configured to receive the indicator signal Q2, and the second input terminal of the selector S0 is configured to receive the indicator signal Q0.

The control terminals of the D flip flops DA0 to DA3 are connected to the NAND gate circuit NAND. The first input terminal of the NAND gate circuit NAND is configured to receive the synchronization signal TCLK, the second input terminal of the NAND gate circuit NAND is configured to receive the read signal READ, and the output terminal of the NAND gate circuit NAND is configured to output the select signal SEL.

Reference is made to FIG. 4. As illustrated in FIG. 4, the sequence circuit 150B includes several flip flop sequences 154B to 154D. For ease of illustration, the following will take the flip flop sequence 154B as an example for description, and the connection mode and the operation mode of the rest of the flip flop sequences 154C and 154D are similar to the flip flop sequence 154B, and the description will not be repeated herein.

As illustrated in FIG. 4, the flip flop sequence 154B includes several D flip flops DB0 to DB3. In the connection relationship, several D flip flops DB0 to DB3 are connected in sequence with the D flip flop DB0, the D flip flop DB1, the D flip flop DB2, and the D flip flop DB3.

The first input terminal of the D flip flop DB0 is configured to receive the input address signal AddrI0 of the input address signals AddrI0 to AddrI2. After receiving the input address signal AddrI0, the D flip flop DB0 temporarily stores the received input address signal AddrI0. The second input terminal of the D flip flop DB0 is configured to receive the temporarily stored address signal output by the D flip flop DB1. The third input terminal of the D flip flop DB0 is configured to receive the synchronization signal TCLK. The output terminal of the D flip flop DB0 is configured to output the temporarily stored address signal temporarily stored by the D flip flop DB0.

The first input terminal of the D flip flop DB1 is configured to receive the input address signal AddrI0 of the input address signals AddrI0 to AddrI2. After receiving the input address signal AddrI0, the D flip flop DB0 temporarily stores the received input address signal AddrI0. The second input terminal of the D flip flop DB1 is configured to receive the temporarily stored address signal output by the D flip flop DB2. The third input terminal of the D flip flop DB1 is configured to receive the synchronization signal TCLK. The output terminal of the D flip flop DB1 is configured to output the temporarily stored address signal D temporarily stored by the flip flop DB1.

The first input terminal of the D flip flop DB2 is configured to receive the input address signal AddrI0 of the input address signals AddrI0 to AddrI2. After receiving the input address signal AddrI0, the D flip flop DB0 temporarily stores the received input address signal AddrI0. The second input terminal of the D flip flop DB2 is configured to receive the temporarily stored address signal output by the D flip flop DB3. The third input terminal of the D flip flop DB2 is configured to receive the synchronization signal TCLK. The output terminal of the D flip flop DB2 is configured to output the temporarily stored address signal D temporarily stored by the flip flop DB2.

The first input terminal of the D flip flop DB3 is configured to receive the input address signal AddrI0 of the input address signals AddrI0 to AddrI2. After receiving the input address signal AddrI0, the D flip flop DB3 temporarily stores the received input address signal AddrI0. The second input terminal of the D flip flop DB1 is configured to receive the synchronization signal TCLK. The output terminal of the D flip flop DB3 is configured to output the temporarily stored address signal D temporarily stored by the flip flop DB3.

Furthermore, each of the first input terminals of the D flip flops DB0 to DB3 connects to the corresponding one of the AND gates A00 to A03. In detail, the first input terminal of the D flip flop DB0 is connected to the AND gate A00, the first input terminal of the D flip flop DB1 is connected to the AND gate A01, the first input terminal of the D flip flop DB2 is connected to the AND gate A02, and the first input terminal of the D flip flop DB3 is connected to the AND gate A03.

In the operational relationship, the first input terminals of the AND gates A00 to A03 are configured to receive the indicator signals Q0 to Q3, the second input terminals of the AND gates A00 to A03 are configured to receive the input address signal AddrI0, the output terminals of the AND gates A00 to A03 are configured to output the input address signal AddrI0. The control terminals of the AND gates A00 to A03 are configured to receive the read signal READ.

It should be noted that, the flip flop sequences 154C and 154D include several D flip flops and AND gates. In detail, the flip flop sequence 154C include several D flip flops DC0 to DC3 and several AND gates A10 to A13, and the flip flop sequence 154D includes several D flip flops DD0 to DD3 and several AND gates A20 to A23. The flip flop sequences 154C and 154D are similar to the flip flop sequence 154B, the difference is that the first input terminals of the several AND gates A10 to A13 of the flip flop sequence 154C are configured to receive the indicator signals Q0 to Q3, and the second input terminals of the several AND gates A10 to A13 are configured to receive the input address signal AddrI1. Moreover, the first input terminals of the several AND gates A20 to A23 of the flip flop sequence 154D are configured to receive the indicator signals Q0 to Q3, and the second input terminals of the several AND gates A20 to A23 are configured to receive the input address signal AddrI2.

Furthermore, the flip flop sequences 154B to 154D are also connected to the tri-state logic enable decoding circuit 152 via one of the D flip flops DB5 to DD5.

Reference is made to FIG. 3 and FIG. 4 together. Through the preset signal PRESET, the indicator signal Q0 is 1, and the indicator signals Q1 to Q3 are 0. When the read signal READ is at a high voltage value, since the indicator signal Q0 is 1, the input address signal AddrI0 is input to the D flip flop DB0 and is temporarily stored in the D flip flop DB0. Similarly, the input address signal AddrI1 is input to the D flip flop DC0 of the flip flop sequence 154C and is temporarily stored in the D flip flop DC0, and the input address signal AddrI2 is input to the D flip flop DD0 of the flip flop sequence 154D and is temporarily stored in the D flip flop DD0.

Assume that the synchronization signal TCLK remains at the high voltage value, when the read signal READ is at a high voltage value, the output of the NAND gate NAND is 0, so that the select signal SEL is 0. At this time, the indicator signals Q0 to Q3 output from the several D flip flops DA0 to DA3 of the sequence circuit 150A shift to the left. That is to say, at this time, the indicator signal Q1 is 1, and the indicator signals Q0, Q2 and Q3 are 0.

If the sequence circuits 150A and 150B receive the next read signal READ with the high voltage value again, the second input address signals AddrI0 to AddrI2 are input to the D flip flop DB1 and are temporarily stored in the D flip flop DB1, the D flip flop DC1 of the flip flop sequence 154C and the D flip flop DD1 of the flip flop sequence 154D.

On the other hand, when the read signal is at a low voltage value, since the synchronization signal TCLK remains at the high voltage value, the output of the NAND gate NAND is 1, so that the select signal SEL is 1. At this time, the indicator signals Q0 to Q3 output by the several D flip flops DA0 to DA3 of the sequence circuit 150A shifts to the right. That is to say, at this time, the indicator signal Q3 is 1, and the indicator signals Q0 to Q2 are 0.

Reference is made to FIG. 4 at the same time. When the synchronization signal TCLK is 1, the temporarily stored address signal Addr0 temporarily stored at the D flip flop DB0 is output to the tri-state logic enable decoding circuit 152. Similarly, the D flip flop of the flip flop sequence 154C closest to the tri-state logic enable decoding circuit 152 outputs the temporarily stored temporarily stored address signal Addr1 to the tri-state logic enable decoding circuit 152, and the D flip flop of the flip flop sequence 154D closest to the tri-state logic enable decoding circuit 152 outputs the temporarily stored temporarily stored address signal Addr2 to the tri-state logic enable decoding circuit 152.

Furthermore, the temporarily stored address signal temporarily stored in the D flip flop DB1 is shift to the D flip flop DB0, the temporarily stored address signal temporarily stored in the D flip flop DB2 is shift to the D flip flop DB1, and the temporarily stored address signal temporarily stored in the D flip flop DB3 is shift to the D flip flop DB2.

Accordingly, the flip flop sequences 154B to 154D of the tri-state logic enable circuit 132A in FIG. 2 output the temporarily stored address signal temporarily stored in the D flip flop with a first in first out method.

Based on the above, when the read signal READ or the read signal READ received by the sequence circuit 150A and the sequence circuit 150B are at the high voltage value, the sequence circuit 150B stores several temporarily stored address signals. When the synchronization signal TCLK or the read signal READ received by the sequence circuit 150A and the sequence circuit 150B are at the low level voltage and the synchronization signal TCLK is at the high level voltage, the sequence circuit 150B outputs the temporarily stored address signal.

Reference is made to FIG. 5. FIG. 5 is a schematic diagram illustrating a decoding table 500 according to some embodiments of the present disclosure. In some embodiments, the decoding table 500 is used by the tri-state logic enable decoding circuit 152 during decoding. The tri-state logic enable decoding circuit 152 generates the corresponding enable signals En0 to En7 according to the input temporarily store address signals Addr0 to Addr2. Each of the enable signals En0 to En7 corresponds to one of the several memory banks 112A to 112H as illustrated in FIG. 1.

In some embodiments, the decoding table 500 is also applicable to 132B of FIG. 2. In this way, when reading the data of one of the memory banks 112A to 112H in FIG. 1, only one corresponding memory bank is enabled to reduce data collision.

It should be noted that, the number of the decoding table 500 and the temporarily stored location signals shown in the present disclosure is for illustrative purposes only, and the embodiments of the present disclosure are not limited thereto. In some embodiments, the synchronization signal TCLK is transmitted via the synchronization signal line TCLK-L as illustrated in FIG. 1, and the input address signals AddrI0 to AddrI2 are transmitted via the address signal line Addr-L in FIG. 1.

In the embodiments of the present disclosure, several control circuits are synchronized through the synchronization signal. With the synchronization signal, the time lag between different memory groups or memory banks is reduced. Furthermore, there is only one synchronization signal in the memory device, which can reduce the complexity of the circuit. In the case of high-speed bandwidth access, when a read signal is received, the address signal is temporarily stored in the control circuit and the read function is enabled. After several delays, the control circuit outputs a signal according to the synchronization signal.

Based on the aforementioned embodiments, the present disclosure provides a memory device. The memory device reduces the collision caused by the time lag between different memory groups or memory banks and reduces the complexity of the circuit.

Various functional elements and blocks have been disclosed herein. For those skilled in the art, the functional blocks can be implemented by circuits (whether dedicated circuits or general-purpose circuits operated under the control of one or more processors and coded instructions), which generally include is configured to a transistor or other circuit elements that controls the operation of an electrical circuit corresponding to the functions and operations described here. As will be further understood, in general, the specific structure and interconnection of circuit elements can be determined by a compiler (compiler), such as a temporarily stored transfer language (Register Transfer Language, RTL) compiler. The temporarily stored transfer language compiler operates on scripts that are quite similar to assembly language codes, and compiles the scripts into a form for layout or making final circuits. Indeed, temporarily stored delivery language is well-known for its role and use in promoting the design of electronic and digital systems.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A memory device, comprising:
   a memory group, comprising a plurality of memory banks; and
   a control circuit, coupled to the memory group, wherein the control circuit comprises:
      a tri-state logic enable circuit, configured to temporarily store a plurality of temporarily stored address signals, to output the plurality of temporarily stored address signals according to a synchronization signal, to decode the plurality of temporarily stored address signals to generate an enable signal, and to transmit the enable signal to one of the plurality of memory banks; the tri-state logic enable circuit comprises a first sequence circuit, configured to generate a plurality of indicator signals according to the synchronization signal and a read signal, the first sequence circuit comprises:
         a first flip flop sequence, comprising a plurality of D flip flops, wherein a first D flip flop of the plurality of D flip flops comprises:
            an output terminal, configured to output a first indicator signal of the plurality of indicator signals;
            a first input terminal, configured to receive a second indicator signal of the plurality of indicator signals output by a second D flip flop of the plurality of D flip flops or a third indicator signal of the plurality of indicator signals output by a third D flip flop of the plurality of D flip flops, wherein the first D flip flop is connected in serious between the second flip flop and the third flip flop;
            a second input terminal, configured to receive one of the read signal and the synchronization signal; and
            a third input terminal, configured to receive a preset signal; and
         an address decoding circuit, configured to decode the plurality of temporarily stored address signals to drive the one of the plurality of memory banks.

2. The memory device of claim 1, wherein the tri-state logic enable circuit outputs the plurality of temporarily stored address signals with a first in first out method.

3. The memory device of claim 1, wherein the tri-state logic enable circuit further comprises:
   a second sequence circuit, configured to store and output the plurality of temporarily stored address signals according to the plurality of indicator signals, the synchronization signal, and the read signal, wherein the second sequence circuit comprises:
  a tri-state logic enable decoding circuit, configured to generate the enable signal according to the plurality of temporarily stored address signals.

4. The memory device of claim 3, wherein when the first sequence circuit and the second sequence circuit receive the read signal, the second sequence circuit stores the plurality of temporarily stored address signals; wherein when the first sequence circuit and the second sequence circuit receive the synchronization signal, the second sequence circuit outputs the plurality of temporarily stored address signals.

5. The memory device of claim 1, wherein the second input terminal of the first D flip flop is connected to an OR gate, wherein the OR gate comprises:
  a first input terminal, configured to receive the synchronization signal;
  a second input terminal, configured to receive the read signal; and
  an output terminal, configured to output the synchronization signal or the read signal to the second input terminal of the first D flip flop.

6. The memory device of claim 1, wherein the first input terminal of the first D flip flop is connected to a selector, the selector comprises:
  a control terminal, configured to receive a select signal;
  a first input terminal, configured to receive the second indicator signal; and
  a second input terminal, configured to receive the third indicator signal.

7. The memory device of claim 6, wherein the first sequence circuit further comprises:
  a NAND gate circuit, comprises:
    a first input terminal, configured to receive the synchronization signal;
    a second input terminal, configured to receive the read signal; and
    an output terminal, configured to output the select signal.

8. The memory device of claim 3, wherein the second sequence circuit further comprises a plurality of flip flop sequences, wherein a first flip flop sequence of the plurality of flip flop sequences comprises:
  a plurality of D flip flops, wherein a first D flip flop of the plurality of D flip flops comprises:
    an output terminal, configured to output a first temporarily stored address signal of the plurality of temporarily stored address signals;
    a first input terminal, configured to receive one of a plurality of input address signals;
    a second input terminal, configured to receive a second temporarily stored address signal of the plurality of temporarily stored address signals output by a second D flip flop of the plurality of D flip flops; and
    a third input terminal, configured to receive the synchronization signal.

9. The memory device of claim 8, wherein the first input terminal is configured to be connected to an AND gate, wherein the AND gate comprises:
  a first input terminal, configured to receive one of the plurality of indicator signals;
  a second input terminal, configured to receive the one of the plurality of input address signals; and
  an output terminal, configured to output the one of the plurality of input address signals.

* * * * *